Aug. 6, 1968 S. SUSSMAN 3,396,361
COMBINED MOUNTING SUPPORT, HEAT SINK, AND ELECTRICAL
TERMINAL CONNECTION ASSEMBLY
Filed Dec. 5, 1966 2 Sheets-Sheet 1

INVENTOR.
Sanford Sussman
BY
Robertson, Bryan, Parmelee & Johnson
ATTORNEYS.

INVENTOR.
Sanford Sussman
BY
Robertson, Bryan, Parmelee & Johnson
ATTORNEYS.

United States Patent Office 3,396,361

Patented Aug. 6, 1968

3,396,361

COMBINED MOUNTING SUPPORT, HEAT SINK, AND ELECTRICAL TERMINAL CONNECTION ASSEMBLY

Sanford Sussman, Hicksville, N.Y., assignor to Solitron Devices, Inc., Tappan, N.Y., a corporation of New York Filed Dec. 5, 1966, Ser. No. 599,287
10 Claims. (Cl. 339—112)

ABSTRACT OF THE DISCLOSURE

The invention provides a combined mounting support, heat sink and electrical terminal connection assembly for mounting a power semiconductor device which, during operation, generates substantial heat and where the heat must be removed for proper operation of the device. An example of a device of this type is a power transistor.

The invention is described with reference to six figures, each of which shows a different way of providing the advantageous combination described for holding a heat generating semiconductor device. The combination comprises a mounting support for the device in which there is a body of metal of a size to act as a heat sink to receive and dissipate the heat generated by the device. A thin coating of dielectric is permanently and intimately adhered to contact portions of the metal body, and a metal heat-conducting member having a heat receiving portion is arranged to be placed in heat receiving relationship to the semiconductor device and another portion of said member is arranged to transmit heat. The heat transmitting portion of said member is intimately adhered to the thin coating of dielectric over a large area to provide an electrically insulated heat transfer path capable of transferring large quantities of heat per unit time from the semiconductor device to the metal body for conducting and dissipating the heat generated by the device.

*Background of the invention*

This invention relates in general to the mounting of semiconductor devices and, more particularly, to the mounting of power semiconductor devices which generate substantial amounts of heat during operation and where such heat must be removed in order to insure proper operation of the semiconductor device.

Successful use of semiconductor devices, and particularly those which carry a high current flow depends to a great extent on the adequate cooling of these devices. If the junction temperature of the semiconductor device rises too high, permanent damage may occur to its operating characteristics, and in the ultimate case, the device may fail completely by melting or thermal runaway. Circuits may also fail before melting or thermal runaway if the semiconductor is insufficiently cooled because the characteristics of the conductor may change, and if there is such change, it may be sufficient to induce malfunction in the circuit in which the semiconductor is placed. For these reasons, all power semiconductors or high current flow semiconductors must be arranged so that the heat which is generated within them may be properly dissipated.

*Summary of the invention*

Accordingly, my invention is a combined mounting support, heat sink and electrical terminal connection assembly for mounting a heat-generating semiconductor device in which, during operation, substantial heat is generated, and which heat must be removed for proper operation of the device. The assembly has a mounting support for the device having a body of metal of a size to act as a heat sink to receive and dissipate the heat that is generated by the power semiconductor device. On contact portions of this heat sink metal body, there is a thin coating of dielectric which is permanently and intimately adhered thereto over a substantial area thereof. A metal heat conducting member which has a heat receiving portion that is arranged to be placed in heat receiving relationship to the heat generating semiconductor device and which has another portion arranged to transmit heat, has its heat transmitting portion intimately adhered to the thin coating of dielectric over a substantial area thereof to provide an electrically insulated heat transfer path from the power semiconductor device to the metal body for both conducting and dissipating the heat that is generated by the device.

Another aspect of my invention is that the heat conducting member which is in intimate heat transfer relationship, but insulated from the metal heat dissipating body is of such a form as to be a terminal for both a conductor from the semiconductor device and a conductor from the circuit into which the device is to electrically connected.

*Brief description of the drawings*

With reference to the accompanying drawings, I shall describe the preferred embodiments of my invention.

In the drawings.

*Description of the preferred embodiments*

In the description hereinafter, for consistency, elements of the invention which have a like function, will be given the same numbers except they will be differentiated by a prefix number in the hundreds corresponding to the figure number in which they appear.

Figures 1, 2:
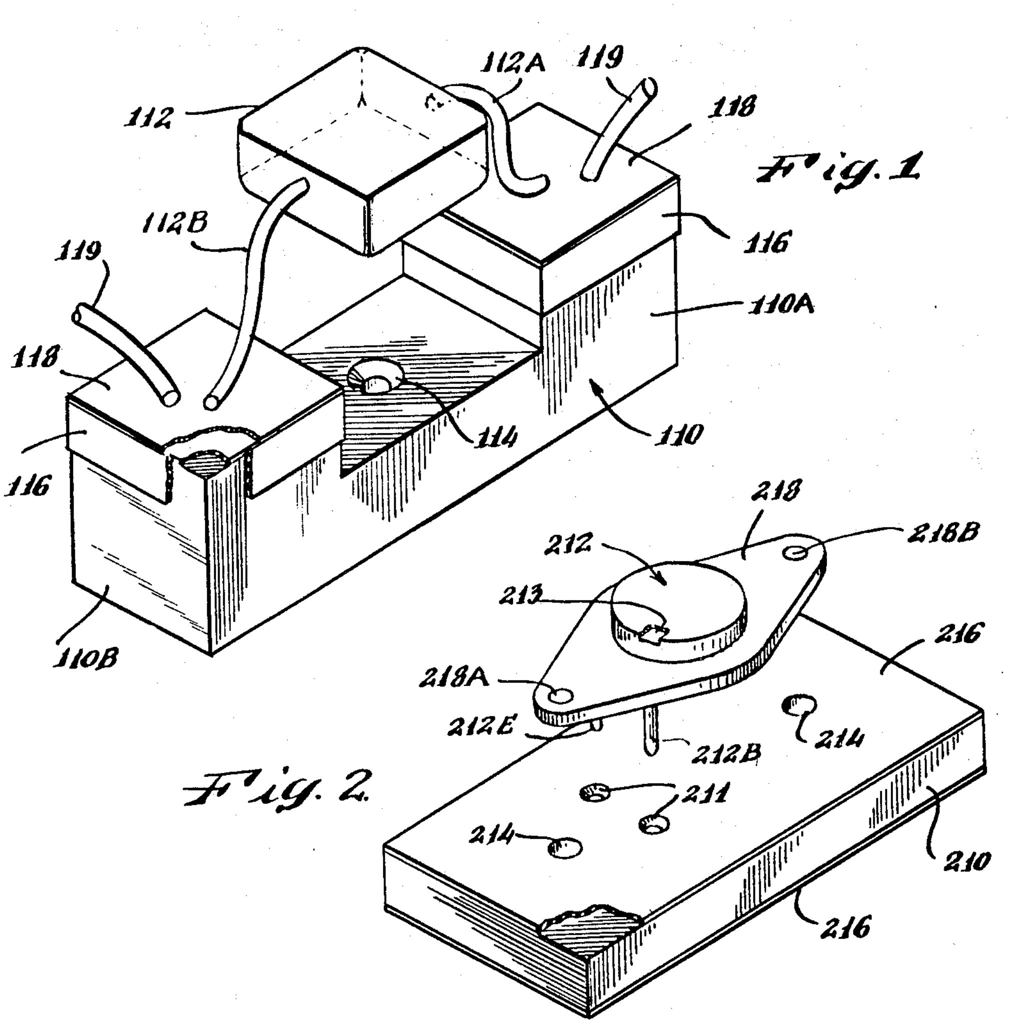
FIGURE 1 is a perspective of one form of my invention.
FIGURE 2 is an exploded perspective of an alternate form of my invention.

The combined mounting support, heat sink and electric terminal connection of the invention as illustrated in FIGURE 1, is particularly adapted for the mounting of a power diode 112 which device, because of the high current load that it may carry, tends to generate substantial heat and which heat must be conducted away from the device in order to insure its proper operation. The assembly comprises a mounting support 110 which is U-shaped with upstanding parallel legs 110A, 110B. The metal support 110 is made of a high heat conducting metal, such as aluminum or copper, and is of such a size as to act as a heat sink to be able to receive and dissipate the heat which is generated by the power diode 112. In the center portion of the base of the heat sink support member 110 there is a mounting hole 114 to which a fastening may be placed to position the support in intimate contact with a metal chassis or the like.

The upper end portions of the upstanding legs 110A, 110B, of the support 110, have disposed thereon a thin coating of dielectric 116, preferably in the thickness range of .005 to .025 inch. The dielectric coating 116 is arranged to cover upper regions of the four sides as well as the end portion of the upstanding legs 110A, 110B, as illustrated in FIGURE 1. Thus, this dielectric coating 116 covers a substantial area of each leg 110A and 110B.

Onto the end portions of the legs 110A, 110B, there are metal heat conducting members 118, which are placed in intimate contact with the thin coating of dielectric over a substantial area thereof to provide an electrically insulated heat transfer path from the heat conducting member 118 to the support member 110. The very ends of the legs 110A, 110B of the support member on which the metal conducting members are placed are termed contact portions of the support member for reasons that are to be made clearer by the subsequent description.

The power diode semiconductor device 112 is arranged to be mounted with its leads 112A, 112B, being soldered to the metal heat conducting members 118, so that there is provided from the heat generating device 112 a heat transfer path through the leads 112A, 112B, to the metal conducting member 118, and thence through the thin dielectric coating 116 into the heat sink support member 110. This path is characterized by the fact that it is heat conductive, capable of transmitting a large quantity of heat per unit time, but it is electrically insulated due to the dielectric properties of the thin coating 118.

The metal heat conducting members 118 on the ends of the legs of the support member 110 are arranged to be of such size that not only may the conductor legs 112A, 112B be soldered thereon, but also these members may have room thereon so that other conductor leads 119 may be soldered thereon to provide the electrical interconnection of the power diode 112 into the circuit in which it is to serve.

The thin dielectric coating 116 as described herein is effective whether it be formed of plastic film of epoxy or polyester as is known in the trade, or be formed of intimately adhered and heat-fused metal oxides, the important criteria being that the coating 116 be in the thickness range of .005 to .025 inch in order to allow good heat transfer while retaining its dielectric property.

In FIGURE 2 there is illustrated a combined mounting support, heat sink and electrical terminal connection assembly especially for a high voltage power transistor, with the arrangement being shown exploded, that is, the power transistor 212 is shown in a position above the surface of the metal support member 210 in order to illustrate the details of the support member. In this form of the invention, the metal support 210 is in the form of a parallelepiped with a large plane upper surface. The heat sink support member 210 has mounting holes 214 through which fastenings will go to hold the member in intimate relationship with either another heat sink, a chassis or the like.

In addition, the support member 210 has a pair of conductor holes 211 therethrough to receive the emitter 212E and base pins 212B of the power transistor 212. As illustrated, the support 210 has the thin coating of dielectric 216 on the upper and lower surfaces and extending through the holes 211, 214. Thus, the dielectric coating 216 extends over a substantial area of the heat sink member 210. The power transistor 212 has a flanged portion thereon which in this embodiment serves the function of the metal heat conducting member 218. The semiconductor device 212 has a metal cap 213 around it and the flanged metal conducting member 218 is in intimate heat receiving relationship to the cap and transistor. The flange is arranged to be placed down on the dielectric coated surface 216 at a contact portion thereof and is held in intimate heat transfer relationship therewith over a substantial area thereof by fastenings that pass through holes 218A and 218B, thence through the fastening holes 214 so that both the flange 218 and the support member 210 are held in intimate relationship to each other and to the chassis or the like on which they may be fastened.

Figure 3:
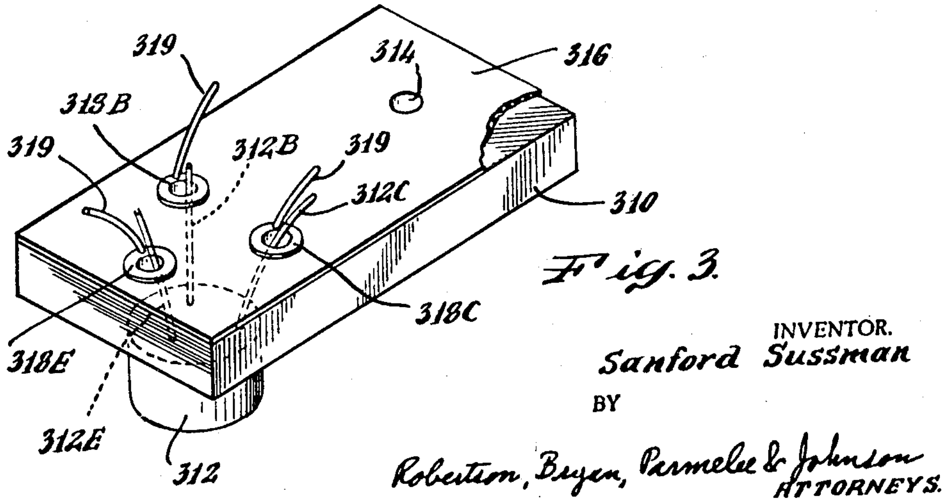
FIGURE 3 is a perspective of a further embodiment of my invention.

In FIGURE 3 there is shown yet another form of combined mounted support, heat sink and electrical connection assembly according to the present invention in which the metal support member 310 is shaped in a manner similar to that of the support member 210 of FIGURE 2. This member 310 also has the thin dielectric coating 316 on its upper plane surfaces and extending through the conductor holes 311. In this embodiment, however, the metal heat conducting member consists of metal plates or pads 318E, 318B, and 318C, which are annular shaped and are permanently and intimately fastened to the dielectric coating about the periphery of conductor holes 311 which pass through the support 310, thus providing a substantial area of intimate contact between these heat conducting members 318B, 318C 318E and the thin dielectric coating 316.

In this arrangement, the power transistor 312 is mounted on the bottom below the support 310, and has its emitter 312E, base 312B, and collector 312C, conductor leads arranged to pass upwardly through the holes in the base and to be soldered to the metal conducting pads 318B, 318C, and 318E. The through holes in the support member 310 would also have themselves insulated or alternatively the conductor leads 318B, 318C and 318E, could have insulators placed thereon so that the leads are protected from electrically shorting to the metal support 310.

The metal heat conducting rings 318 act as terminals in that the leads from the power transistors 312 would be soldered thereon and the leads 319 from the circuit into which the power transistor is to be connected are also soldered to the metal pieces 318. Thus, there are provided a heat transfer path from the heat generating device 312 through the leads to the metal members 318 and thence through the thin dielectric coating 316 into the heat dissipating metal base 310.

It should be noted that the arrangement as shown in FIGURE 3 may be used as the arrangement which would be on the bottom side of the device illustrated in FIGURE 2, so as to provide terminal points for both the transistor lead, the exterior circuit to be connected to the power transistor 212 of the device. In such a case, insulating mounting hole 314 would be provided.

Figures 4, 5:
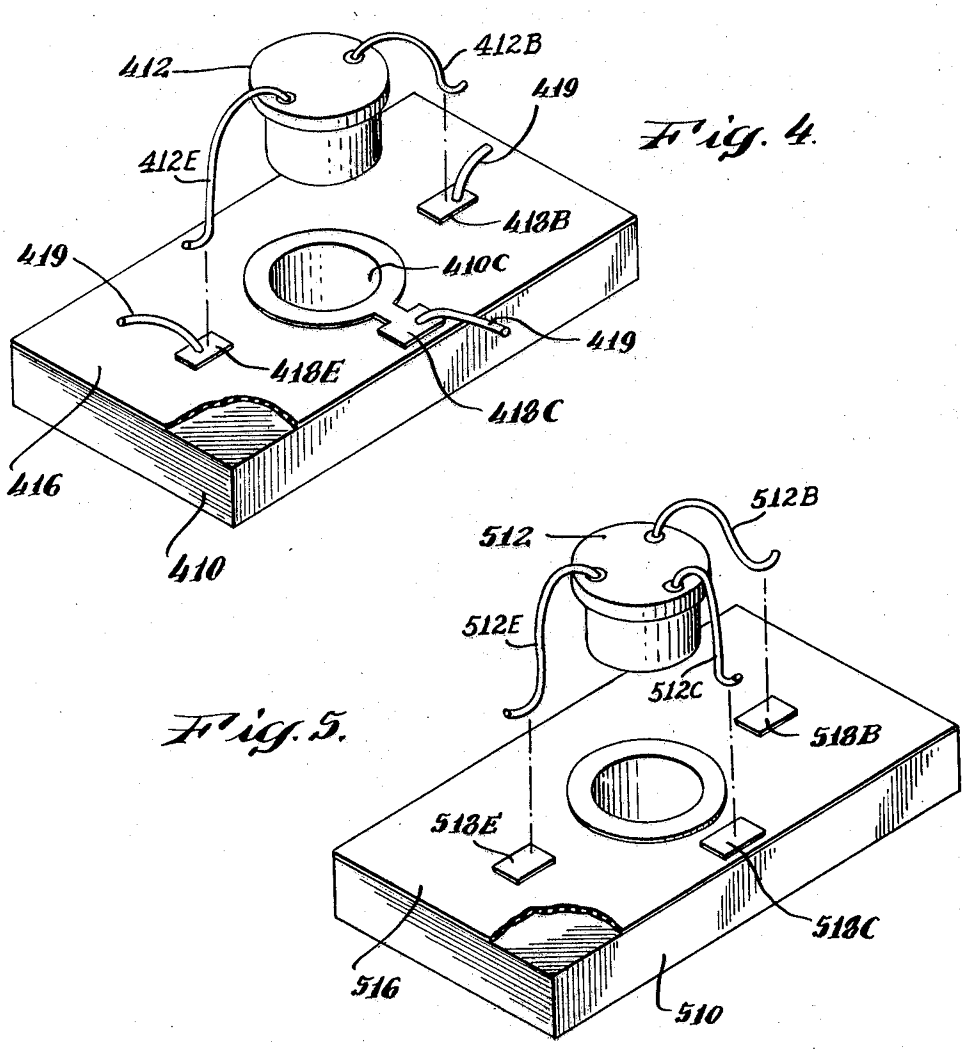
FIGURES 4, 5 and 6 are exploded perspectives of a further embodiment of the invention, each with different variations of conductor terminal attachments.

FIGURE 4 illustrates the further alternate embodiment of the invention in which the combined mounting support, heat sink and electrical terminal connection assembly is specifically provided for a power semiconductor transistor device 412 in which the body of the device is contained within a metal casing and a major portion of the body of a semiconductor device is arranged to be seated within the metal support member 410. The metal support member 410 has a hole 410C therein which is of a predetermined size to require that when said electrical heat generating device is placed within said hole, the device must be force-fitted within the hole. Another way to describe the type of fit would be to call it an interference fit. That is, the diameter of the hole 410C is a thousandths or so less than the outer diameter of the casing surrounding the power device 412.

The support piece 410, as illustrated in FIGURE 4, is a rectangular parallelepiped with a large planar surface that is disposed thereon over a substantial area thereof, a thin coating of dielectric 416. In this embodiment, the metal heat conducting members 418B, 418C and 418E also act as terminal points. The heat conducting members 418, are metal pieces that are in intimate permanent contact with the dielectric coating 16, and in this case the metal conductor 418C, is extended so as to cover the interior of the hole 410C into which the power transistor 412 is forcefitted to provide an intimate heat transfer relationship between the casing of the power transistor and the metal conductor 418C, whereby the heat may flow from the transistor 412 through the heat conducting member 418C, and through the thin dielectric coating 416 into the metal support member 410.

In addition, in this particular embodiment, the heat which is conducted along the leads 412E, 412B, from the emitter and base of the transistor 412 is transmitted to the metal conductors 418E and 418B, when the leads are soldered thereto. Thus, the heat which is conducted along these leads is transferred into the metal pads 418B and 418E through the dielectric coating and into the metal base 410. Also, in this embodiment as in the embodiments of FIGURE 1 and FIGURE 3, the metal conductor pads 418B and 418E are of such a size that they may also have connected thereto the leads 419 from the external circuit into which the power transistor 412 is to be connected. Further, the metal pads 418 have a tag portion 418C or terminal portion illustrated in the forepart of the drawing to which an external lead 419 may be connected.

In FIGURE 5 there is illustrated another form of the invention that is shown in previous FIGURE 4, but it differs in that the metal casing on the semiconductor power transistor 512 is not the collector element. The semiconductor 512 has a separate collector lead 512C that goes to a separate metal terminal piece 518C. In all other respects, the embodiment is the same as described with respect to FIGURE 4. The casing of the transistor is of such a size to be force-fitted into the hole recessed within the metal support block 510. Thus, in the illustration of the invention in FIGURE 5, the power transistor 512 generates its heat and this heat is conducted by two separate paths, one through the metal casing of the transistor to the metal conductor portions that surround the inside of the hole in the block 510, and thence through the insulation and the block, and alternatively the heat would flow out of the transistor 512 through the three leads of the emitter, the base, and the collector to the metal pads 518B, 518C, 518E, and thence through the thin dielectric coating 516 into the metal block 510 to be dissipated therefrom.

Figure 6:
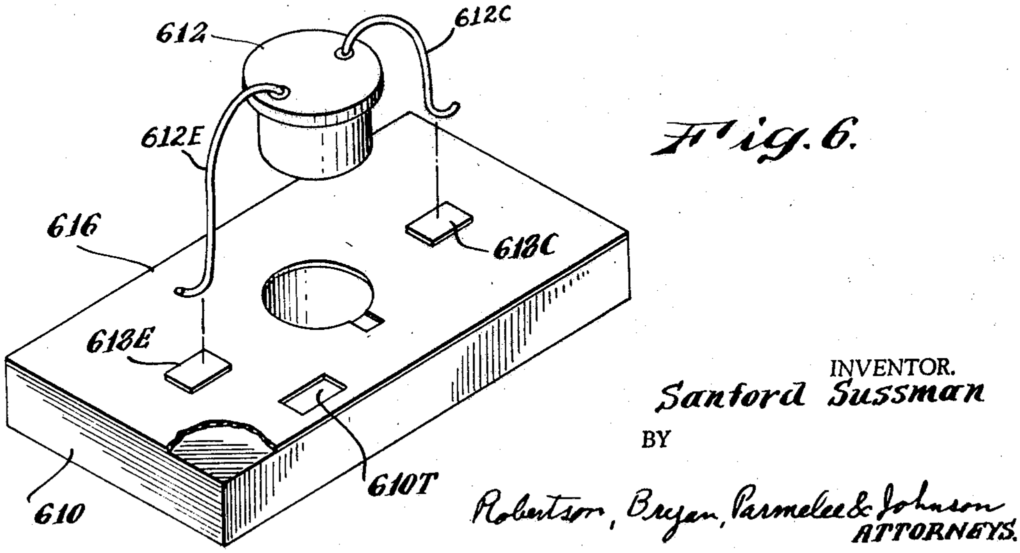

The modification of the invention of FIGURES 4 and 5 that is shown in FIGURE 6 is to the effect that the metal support 610 has only a thin dielectric coating 616 on its upper surface extending over a substantial area thereof, and the hole which is in the center of the block to receive the power transistor 612 is uncoated, the power transistor 612 being of the type where the external casing thereof is the base conductor. Thus, when the casing is in intimate relationship or force-fitted into the support 610, the heat which is generated within the transistor may be at least in part transmitted through the casing into the metal block by a good heat transfer relationship. The top of the block 610 has a bare portion 610T which may be used as a terminal.

The remaining portion of the heat that is generated in the power transistor 612 is conducted through the emitter 612E and the collector 612C leads which are attached to the metal conductor pads 618E and 618C that are in intimate relationship with the thin dielectric coating 616 on the surface of the support block 610. These leads are soldered to the pads 618C, 618E, and the pads are of such a size that they may have room thereon for external conductors, not shown, to be soldered to the pads so that the transistor 612 may be connected to the circuit in which it is to work. The heat transfer path that is provided is from the transistor 612 through the leads 612E, 612C into the pads 618C and 618E through the thin dielectric under the pads 516 and then to the metal support plate 610, whence the heat shall be dissipated.

It is to be noted that the definition of a heat generating semiconductor device as used here is intended to mean only those semiconductor devices, such as power transistors, power diodes and the like, in which there flows significant amounts of current and wherein substantial heat is generated as a result of the current flow.

A factor in the invention which should be noted is the dual role that is played by the metal conductors whereby they serve both as a device for dissipating heat directly to the heat sink support member as well as being of a size so that natural convection will play a part in cooling the same. Additionally, they have the function of serving as a connector or a junction to which may be connected the leads from both the power transistor and the leads extending to the external circuit. The fact that the metal conductor is in intimate heat transfer relationship with the thin dielectric coating over a substantial area provides a heat shunt so that the heat will either go to the atmosphere or to the metal base while the current is allowed to flow through the conductor and into the circuit into which the power transistor is connected.

Although the various features of the invention have been shown as applied to several embodiments of the invention, it will be evident that changes may be made in such details and certain features may be used without others, without departing from the principles of the invention.

I claim:

1. A combined mounting support, heat sink, and electric terminal connection assembly for mounting a heat generating semiconductor device in which, during operation, substantial heat is generated which heat must be removed for proper operation of the device, the assembly comprising a mounting support for said device having a body of metal of a size to act as a heat sink to receive and dissipate the heat generated by said device, a thin coating of dielectric permanently and intimately adhered to contact portions of said metal body and extending over a substantial area thereof, a metal heat conducting member having a heat receiving portion arranged to be placed in heat receiving relationship to said heat generating semiconductor device by lead terminal conductor means extending from said device and another portion of said member arranged to transmit heat, such heat transmitting portion of said member being intimately adhered to said thin coating of dielectric over a large area to provide an electrically insulated heat transfer path capable of transferring large quantities of heat per unit time from said device to said metal body for conducting and dissipating the heat generated by said device.

2. An assembly according to claim 1 in which said heat conducting member is of such a form as to be a terminal for both said lead terminal conductor means and a conductor from the circuit to which said device is to be electrically connected.

3. A combined mounting support, heat sink, and electric terminal connection assembly for mounting a heat generating semiconductor device in which, during operation, substantial heat is generated which heat must be removed for proper operation of the device, the assembly comprising a mounting support for said device having a body of metal of a size to act as a heat sink to receive and dissipate the heat generated by said device, said heat sink body of metal having a hole therein of a predetermined size to require said electrical heat generating device to be force-fitted within said hole in said body of metal to provide an intimate heat conducting relationship between said body of metal and said electric heat generating device, a thin coating of dielectric permanently and intimately adheared to contact portions of said metal body and extending over a substantial area thereof, a metal heat conducting member having a heat receiving portion arranged to be placed in heat receiving relationship to said heat generating semiconductor device and another portion of said member arranged to transmit heat, such heat transmitting portion of said member being intimately adhered to said thin coating of dielectric over a large area to provide an electrically insulated heat transfer path capable of transferring large quantities of heat per unit time from said device to said metal body for conducting and dissipating the heat generated by said device.

4. An assembly according to claim 3 in which the bounding surfaces of said hole comprise at least in part said contact portions of said body of metal coated by said thin coating of dielectric.

5. An assembly according to claim 1 in which said dielectric coating is in the thickness range of .005 to .025 inch whereby said dielectric coating provides good heat transfer characteristics while maintaining its dielectric property of electrical insulation.

6. An assembly according to claim 1 in which said mounting support is U-shaped having a base portion and a pair of upstanding parallel legs extending from the opposite ends thereof, and said semiconductor device is seated directly on said mounting support base portion.

7. An assembly according to claim 6 in which said dielectric coating covers at least the upper region of each of said upstanding legs and said metal heat conducting member covers a substantial area of said dielectric coating.

8. An assembly according to claim 3 in which said mounting support has a plane upper surface, said semiconductor device being encased in a metal casing having a flanged portion, whereby said flanged portion constitutes said heat-conducting member.

9. An assembly according to claim 3 in which said mounting support has a plane upper surface having said dielectric layer disposed thereon, and wherein said metal heat conducting member includes a plurality of metal plates disposed on said dielectric layer having said lead terminal conductor means electrically connected thereto.

10. An assembly according to claim 9 in which said semiconductor device is encased in a metal casing which serves as one of the semiconductor device lead terminals, said plane surface being substantially covered by said dielectric layer except for a relatively small portion thereof rendered bare of said dielectric coating whereby said bare surface portion of said mounting support serves as terminal for said one device lead terminal.

References Cited

UNITED STATES PATENTS

| | | | |
|---|---|---|---|
| Re. 25,184 | 6/1962 | McAdam | 339—112 X |
| Re. 25,853 | 9/1965 | Van Namen | 339—112 X |
| 3,139,560 | 6/1964 | Phillips | 339—17 X |
| 3,261,396 | 7/1966 | Trunk. | |
| 3,275,921 | 9/1966 | Fellendorf. | |

OTHER REFERENCES

IBM Technical Disclosure Bulletin "Ceramic Bonded Circuit Board," G. McDonald, vol. 6, No. 1 June 1963, p. 1.

RICHARD E. MOORE, *Primary Examiner.*